United States Patent [19]

Chen et al.

[11] Patent Number: 5,087,958
[45] Date of Patent: Feb. 11, 1992

[54] MISALIGNMENT TOLERANT ANTIFUSE

[75] Inventors: Shih-Oh Chen, Fremont; Steve S. Chiang, Saratoga; Gregory W. Bakker, Sunnyvale, all of Calif.

[73] Assignee: Actel Corporation, Sunnyvale, Calif.

[21] Appl. No.: 609,177

[22] Filed: Nov. 5, 1990

[51] Int. Cl.$^5$ .................. H01L 29/04; H01L 27/02; H01L 29/34
[52] U.S. Cl. .................................... 357/51; 357/59; 357/54; 437/922
[58] Field of Search .................. 357/51, 59, 54; 437/922; 148/DIG. 55

[56] References Cited

U.S. PATENT DOCUMENTS 4,899,205  2/1990  Hamdy et al. .................. 357/51
5,019,532  5/1991  Kaya .................. 437/186

Primary Examiner—Mark Prenty
Attorney, Agent, or Firm—Kenneth D'Alessandro

[57] ABSTRACT

A misalignment tolerant antifuse includes a lower electrode, bounded by a relatively thick first insulating layer, an upper electrode separated from the lower electrode by a second insulating layer having a thickness less than that of the first insulating layer, a pair of antifuse window regions in the second insulating layer, abutting the first insulating layer on opposite sides of the lower electrode, the insulating material in the window regions being thinner than the remainder of the second insulating layer, and an upper electrode disposed above the second insulating layer and lying over the pair of regions and at least a portion of the first insulating layer.

19 Claims, 3 Drawing Sheets

MISALIGNMENT TOLERANT ANTIFUSE

BACKGROUND OF THE INVENTION

1. Field Of The Invention

The present invention pertains to antifuse design for use in user configurable integrated circuits and the like. More particularly, the present invention pertains to an antifuse having a reduced susceptibility to misalignment of the mask layers which are used to form its features during the semiconductor fabrication process.

2. The Prior Art

Antifuses generally consist of two conductive electrodes separated by one or more layers of insulating material. Antifuses may be fabricated using standard semiconductor processing techniques. The lower conductor is covered with an insulating material, typically a silicon dioxide layer, into which a window is etched in the region where it is desired to fabricate the antifuse. The antifuse dielectric is then formed in this window region and is covered by one or more conductive layers which will serve as the upper electrode.

The actual vertical conductive area of a programmed antifuse is relatively small. In order to maximize circuit performance, it is desirable to make the antifuse dielectric window area as small as possible to minimize the capacitance contributed to the circuit by the antifuses which are to remain unprogrammed in the finished circuit after programming.

The desire to minimize the area of the dielectric window is counterbalanced, however, by the inherent limitations in photolithographic alignment techniques. At some point, the dielectric window area may be made so small that etching techniques or mask misalignments commonly encountered and considered normal in the semiconductor fabrication process can result in the window being placed such that no antifuse will be formed where one is intended to be formed.

Current design techniques have only one antifuse cell window in each antifuse cell. This window must be large enough to guarantee that an antifuse can exist within the misalignment tolerances which are characteristic of the process used to fabricate the integrated circuit containing the antifuses. In order to accommodate the expected worst-case misalignment, certain design margins must be placed into the antifuse layout, resulting in an increase of the capacitance of an antifuse which will ultimately remain unprogrammed in the finished and programmed integrated circuit. Typical present designs utilize an antifuse area of approximately 0.72 $\mu m^2$, e.g., 1.2 $\mu m \times 0.6$ $\mu m$, with a 1.2 $\mu m$ technology.

BRIEF DESCRIPTION OF THE INVENTION

The present invention is a minimum geometry antifuse having a reduced susceptibility to mask misalignment. A lower antifuse electrode is formed from a diffused region in a semiconductor substrate. A relatively thick insulating layer, such as silicon dioxide is then formed over the surface of the substrate. First and second antifuse dielectric windows are patterned at the same time on the surface of the insulating layer, which is then etched to the surface of the semiconductor substrate. The first and second windows are so located with respect to the underlying diffused region that when photolithographic misalignment occurs between antifuse cell windows and diffusion layers, one cell window opening may decrease in area or even disappear, but the other cell window opening will increase in area. The antifuse dielectric is then formed in the windows and the upper electrode is then formed over the surface of the antifuse dielectric. The photolithographic misalignment insensitive antifuse of the present invention greatly improves the manufacturability of an antifuse having very small cell windows.

DETAILED DESCRIPTION OF A PREFERRED EMBODIMENT

The materials used to form the layers in the antifuses of the present invention, and the processes used to fabricate them, may be chosen from among the many variations of existing technology. Examples of that technology, which are by way of illustration only, and are not intended to be in any way limiting, include the technology disclosed in U.S. Pat. No. 4,823,181, to Mohsen et al., issued Apr. 18, 1989, and U.S. Pat. No. 4,899,205, to Hamdy et al., issued Feb. 6, 1990. Both of these patents are expressly incorporated herein by reference.

Figure 1A:
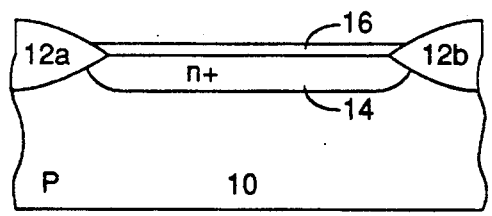
FIGS. 1a-1d are cross sectional views of a typical prior art antifuse structure at selected points during the fabrication process.

Referring first to FIGS. 1a-1d, cross sectional views of a typical prior art antifuse structure are shown at various points during a typical fabrication process. In FIG. 1a, a semiconductor substrate 10, including conventional field oxide regions 12a and 12b, contains a doped region 14, which may be created using known semiconductor processing techniques. Doped region 14 acts as the lower electrode of the antifuse.

An insulating layer 16, usually silicon dioxide formed using known semiconductor processing techniques, lies over the surface of the substrate between field oxide regions 12a and 12b. The structure depicted in FIG. 1a is the cell area in which an antifuse i cell will be fabricated.

Figure 1B:
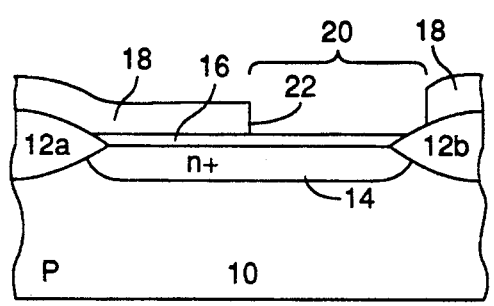

In FIG. 1b, a photoresist layer 18 has been placed over the surface of insulating layer 16 and field oxide regions 12a and 12b, and an antifuse window 20 is formed by photolithographic masking and developing steps as is well known in the art. Those of ordinary skill in the art will recognize that the area occupied by antifuse window 20 will vary from wafer to wafer, depending on the skill of the operator and the inherent accuracy of the photolithography equipment used in the fabrication process. Thus, the distance between the edge 22 of photoresist layer 20 and the tip of the birds beak of field oxide region 12b will vary depending on these factors mentioned above.

Figure 1C:
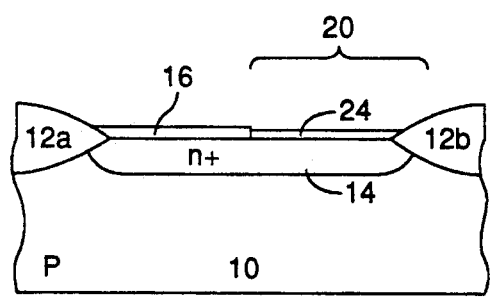

FIG. 1c shows the resulting structure after the portion of insulating layer 16 exposed in antifuse window 20 has been etched away using conventional processing techniques to expose the bare surface of substrate 10 containing doped region 14. An antifuse dielectric 24, which is typically less than 100 Å thick, is then formed in the window area using any of the known techniques in the art for growing antifuse dielectric layers.

Figure 1D:
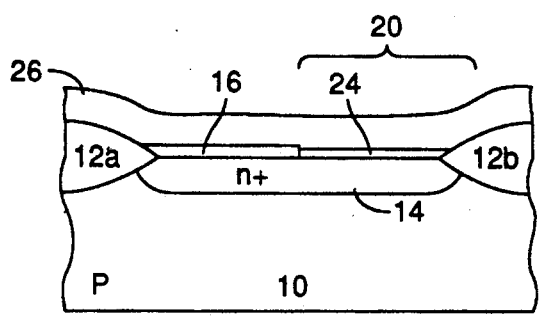

In FIG. 1d, the completed antifuse structure is shown after an upper conductor layer 26 has been formed over the surface of insulating layer 16 and antifuse dielectric 24. Upper conductor 26 may be formed from a variety of materials, including polysilicon, polysilicides or barrier metals, or metals.

It is plain that the main component of the capacitance of the completed antifuse structure is going to be directly proportional to the are of the antifuse dielectric 24. Because of the probability of misalignment with respect to the birds beak of field oxide region 12b, the mask which is used to expose photoresist layer 18 to create antifuse window 20, the designer of the antifuse must provide a designed area large enough so that an acceptably small number of antifuse windows 20 will fail to be formed due to lateral misalignment of that mask. As is apparent, the margin of extra antifuse window area which must be allotted to the design to compensate for the expected misalignment statistically increases the capacitance of the finished antifuses.

Referring now to FIGS. 2a-2d, the structure of the present invention, resulting from the same series of fabrication steps, will be shown. First, referring to FIG. 2a, the same semiconductor substrate 10, including conventional field oxide regions 12a and 12b, contains a doped region 14 acting as the lower electrode of the antifuse, which may be created using known semiconductor processing techniques.

Figure 2A:
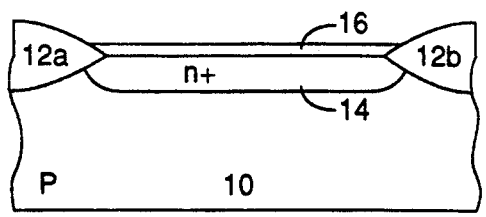
FIGS. 2a-2d are cross sectional views of an antifuse structure according to a presently preferred embodiment of the invention at selected points during the fabrication process.

An insulating layer 16, usually silicon dioxide formed using known semiconductor processing techniques, lies over the surface of the substrate between field oxide regions 12a and 12b. The structure depicted in FIG. 2a is identical to the structure of FIG. 1a and is the cell area in which an antifuse cell will be fabricated.

Figure 2B:
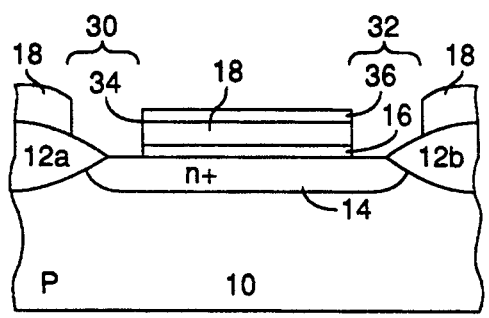

In FIG. 2b, a photoresist layer 18 has been placed over the surface of insulating layer 16 and field oxide regions 12a and 12b, just like in the structure of FIG. 1b. However, unlike the single window 20 formed in the structure of FIG. 1b, in the structure of FIG. 2b, first antifuse window 30 bounded on one end by field oxide region 12a, and second antifuse window 32 bounded on one end by field oxide region 12b are formed by patterns in the in the mask which is used to expose photoresist layer 18 by the same photolithographic masking and developing steps as used for the structure of FIG. 1b.

Those of ordinary skill in the art will recognize that the alignment of first and second antifuse windows 30 and 32 will vary from wafer to wafer, but such persons will also recognize that any misalignment in a direction along an axis from field oxide region 12a to field oxide region 12b will cause one of windows 30 and 32 to contract in area while the other region simultaneously expands. It will be apparent that the probability of failure to form an antifuse window is thus greatly reduced by the utilization of two antifuse windows 30 and 32.

Figure 2C:
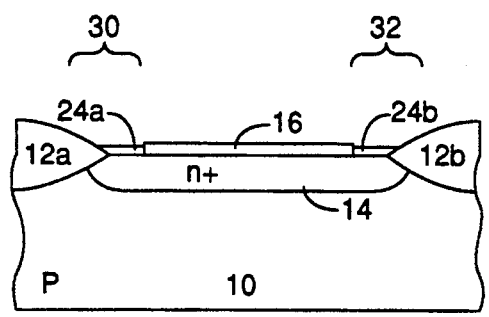

FIG. 2c shows the resulting structure after the portions of insulating layer 16 exposed in antifuse first and second antifuse windows 30 and 32 have been etched away using conventional processing techniques to expose the bare surface of substrate 10 containing doped region 14. The antifuse windows may be opened by wet etching, dry etching, or combinations of wet/dry etching. Presently, dry etching is preferred in order to assure clearing the oxide and formation of small antifuse windows such as those involved in the practice of the present invention. Antifuse dielectrics 24a and 24b are then formed in first and second windows 30 and 32 using any of the known techniques in the art for growing antifuse dielectric layers.

Figure 2D:
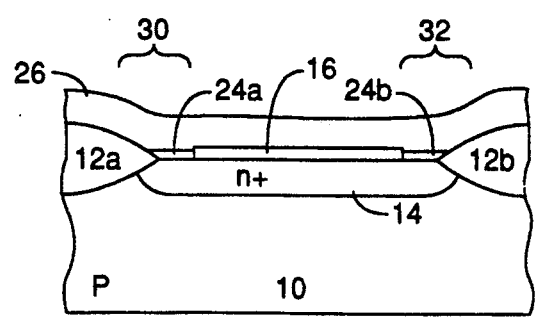

In FIG. 2d, the completed antifuse structure is shown after an upper conductor layer 26 has been formed over the surface of insulating layer 16 and antifuse dielectric 26. As in the prior art antifuse structure shown in FIG. 1d, upper conductor 26 of the antifuse of the present invention may be formed from a variety of materials, including polysilicon, poly silicides, barrier metals, or metals, as will be readily apparent to those of ordinary skill in the art.

From a comparison of FIGS. 1a-d and 2a-d, those of ordinary skill in the art will recognize that the same fabrication process which is used to form the prior art antifuse may be used to form the antifuse of the present invention, with the only difference being in the two apertures per antifuse cell used in the mask used to expose photoresist layer 18. Thus, the antifuse of the present invention may be fabricated using the same process as is used to fabricate prior art antifuses with only a single mask change.

Figures 3, 4:
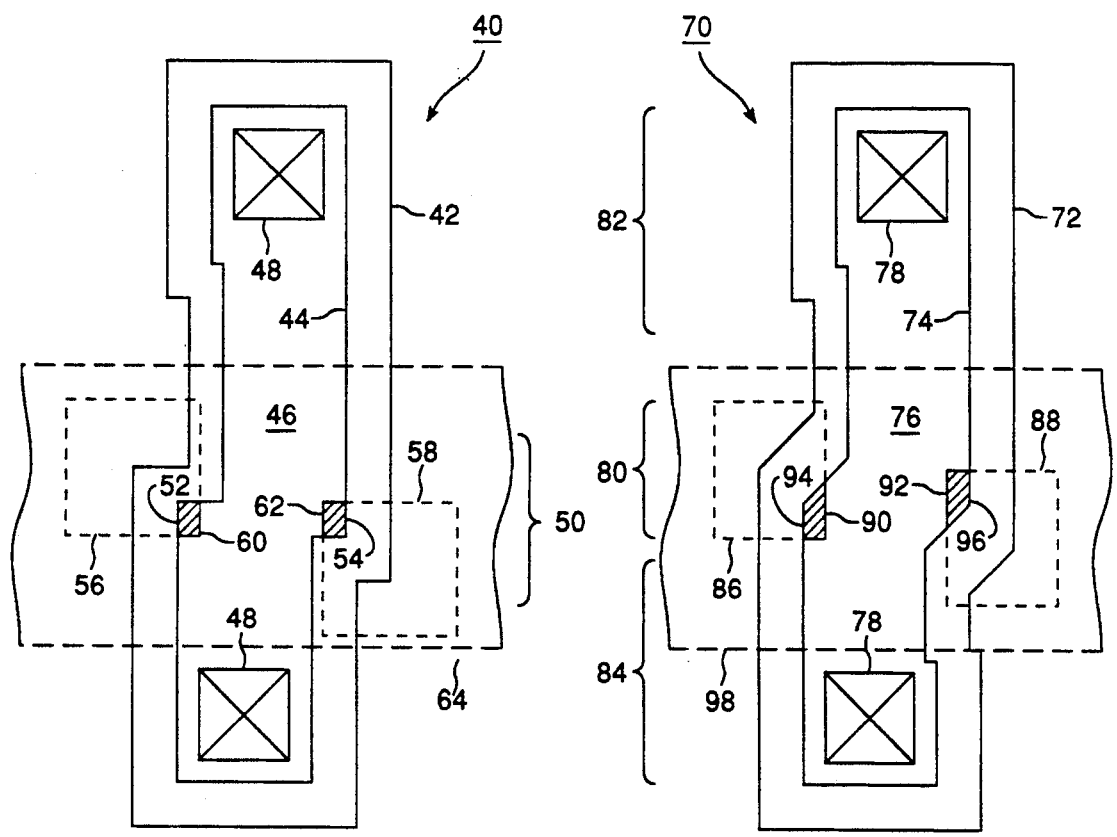
FIG. 3 is a top view of a layout of an antifuse cell according to the present invention.
FIG. 4 is a top view of an alternate layout of an antifuse cell according to the present invention.

Referring to FIG. 3, a top view of the structure of an antifuse 40 according to one possible embodiment of the present invention is shown. Line 42 indicates the beginning of the birds beak where the field oxide layer starts to become thinner. The field oxide region is the area outside of and surrounding line 42. Line 44 indicates the tip of the birds beak and the active region 46 in the substrate lies within line 44. Contacts 48 allow electrical connection to the lower electrode in the active region 46 of the antifuse 40.

In one embodiment of the present invention, as shown in FIG. 3, the active region 46 is generally rectangular and includes an offset 50, where the upper and lower portions of active region 46 are shifted from one another in the X direction along FIG. 3. Offset 50 is located at about the midpoint of the length of active region 46, and creates corners 52 and 54 in the active region 46 of antifuse 40.

Antifuse window mask apertures 56 and 5 (shown by dashed lines) are positioned such that small portions 60 and 62, respectively (shown by diagonal shading) of their areas overlap corners 52 and 54, respectively. The antifuse windows for antifuse 40 are portions 60 and 62 of antifuse window mask apertures 56 and 58. The antifuse dielectric (not shown in FIG. 3) will be formed in areas 60 and 62.

Upper electrode 64 is disposed above the surface of the substrate containing active region 46 and positioned so that it is centered over antifuse windows 60 and 62.

From an examination of FIG. 3, those of ordinary skill in the art will appreciate that misalignment of the mask layer which contains antifuse window mask apertures 56 and 58 in either the X direction, the Y direction, or both, will result in a decrease in the area of one of antifuse windows 60 or 62, with a corresponding increase in the area of the other one of antifuse windows 60 or 62. Because of this, the combined areas of both windows 60 and 62 may be made smaller than a single window area for a prior art antifuse fabricated according to FIGS. 1a-d. The reduced area results in reduced capacitance, which is beneficial for programming and for circuit performance after programming. Using the same opening size as that used in FIGS. 1a-d, a total antifuse window area of 0.24 $\mu m^2$ has been achieved, an area reduction which cuts capacitance by at least 66%. Using the present invention windows having areas less than about 1.0 $\mu m^2$ can be reliably achieved, and windows as small as or smaller than about 0.16 $\mu m^2$ may be formed.

While the embodiment of the invention disclosed in FIG. 3 is less sensitive to misalignment, it creates somewhat more of a manufacturing risk because of corners 52 and 54 in the diffusion area instead of only diffusion edge. The birds beak corner has a higher stress concentration than the birds beak edge and is more likely to cause antifuse short circuits or early breakdowns during programming. The embodiment of the invention disclosed with respect to FIG. 4 reduces these problems.

Referring now to FIG. 4, a top view of the structure of an antifuse 70 according to another embodiment of the present invention is shown. Line 72 indicates the beginning of the birds beak where the field oxide layer starts to become thinner. The field oxide region is the area outside of and surrounding line 72. Line 74 indicates the tip of the birds beak and the active region 76 in the substrate lies within line 74. Contacts 78 allow electrical connection to the lower electrode in active region 76 of the antifuse.

In the embodiment of the present invention shown in FIG. 4, the active region 76 is generally rectangular with an offset 80 located at about the midpoint of its length. Offset 80 is similar to offset 50 in antifuse 40 of FIG. 3, but, unlike offset 50 in antifuse 40, offset 80 does not create 90° corners such as 52 and 54 in the active region 46 of antifuse 40, but is layed out such that the upper and lower portions 82 and 84 of active region 76 are joined by an angles of greater than 90°, preferably around 135°.

Antifuse window mask apertures 86 and 88 (shown by dashed lines) are positioned such that small portions 90 and 92, respectively (shown by diagonal shading) of their areas overlap the apexes 94 and 96, respectively, of the angles joining upper and lower portions 82 and 84 of active region 76. The antifuse windows for antifuse 70 are portions 90 and 92 of the window mask apertures 86 and 88. The antifuse dielectric (not shown in FIG. 3) will be formed in areas 90 and 92. Upper electrode 98 is disposed above the surface of the substrate containing active region 76 and positioned so that it is centered over antifuse windows 90 and 92.

The antifuse of FIG. 4 has the same reduced susceptibility to misalignment of the mask layer which defines regions 86 and 88 as does the embodiment of FIG. 3. The layout of FIG. 4 is presently preferred to that of FIG. 3 because of its avoidance of sharp corners.

Figure 5:
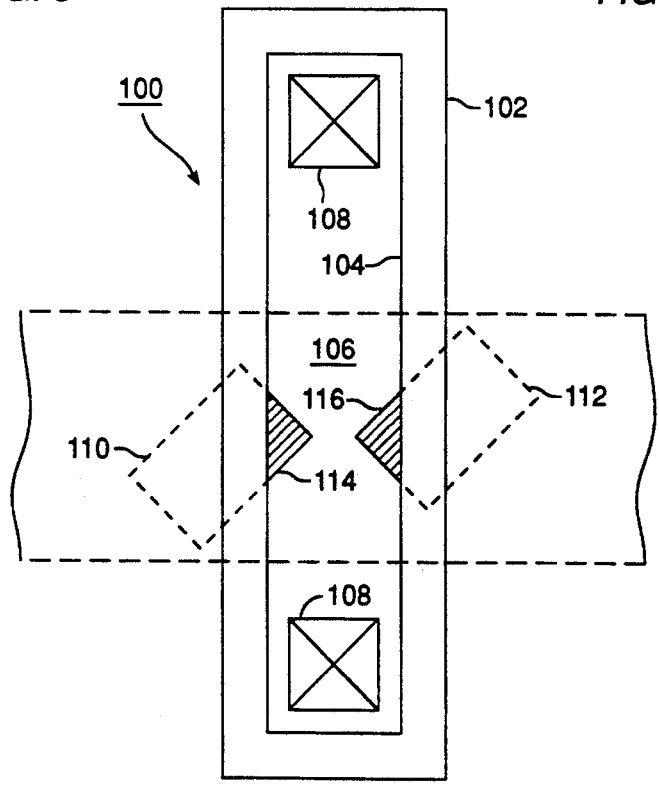
FIG. 5 is a top view of a layout of an antifuse cell according to a presently preferred embodiment of the present invention.

A presently preferred embodiment of the present invention which further reduces susceptibility to stress generated at birds beak corners (either 90° or 135°) is disclosed with reference to FIG. 5. Referring now to FIG. 5, a top view of an antifuse 100 according to the present invention is shown. Line 102 indicates the beginning of the birds beak where the field oxide layer starts to become thinner. The field oxide region is the area outside of and surrounding line 102. Line 104 indicates the tip of the birds beak and the active region 106 in the substrate lies within line 104. Contacts 108 allow electrical connection to the lower electrode in active region 106 of the antifuse.

In the embodiment of the present invention shown in FIG. 5, the active region 106 is generally rectangular, but, unlike the embodiments of FIGS. 3 and 4, has no offsets creating birds beak corners.

Generally rectangular shaped antifuse window mask apertures 110 and 112 (shown by dashed lines) are oriented and are positioned such that small portions 114 and 116, respectively (shown by diagonal shading) of their areas, bounded by one of their corners, overlap the birds beak edges 104 of field oxide. The antifuse windows for antifuse 100 are portions 114 and 116 of antifuse window mask apertures 110 and 112. The antifuse dielectric (not shown in FIG. 5) will be formed in areas 114 and 116. Upper electrode 118 is disposed above the surface of the substrate containing active region 106 and positioned so that it is centered over antifuse windows 114 and 116.

The antifuse of FIG. 5 has the same reduced susceptibility to misalignment of the mask layer which defines regions 114 and 116 as do the embodiments of FIGS. 3 and 4. The layout of FIG. 5 is preferred because of its avoidance of birds beak corners in the antifuse region of the active areas.

The present invention includes embodiments wherein the lower electrode is disposed in a layer located above and insulated from the surface of the semiconductor substrate. Such layers include polysilicon layers and metal layers, and known variations of such layers, such as where barrier metal layers are employed. An illustrative example is disclosed with reference to FIGS. 6a and 6b, from which those of ordinary skill in the art will readily be able to fabricate variations.

Figure 6A:
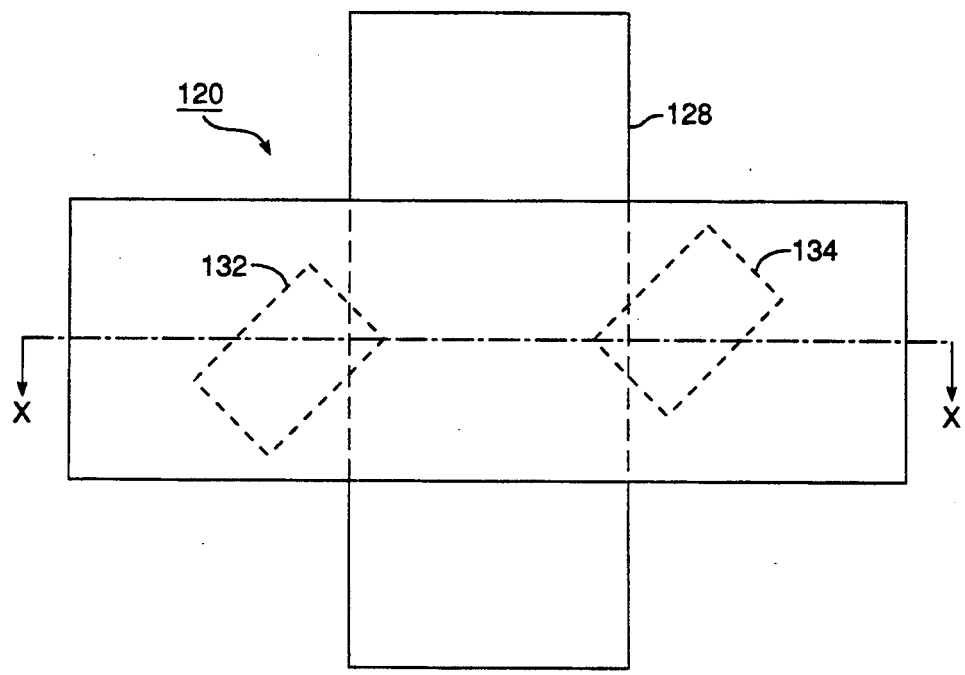
FIGS. 6a is a top view of an antifuse according to the present invention wherein both lower and upper electrodes are disposed in layers of the integrated circuit located above and insulated from the surface of the semiconductor substrate.
Figure 6B:
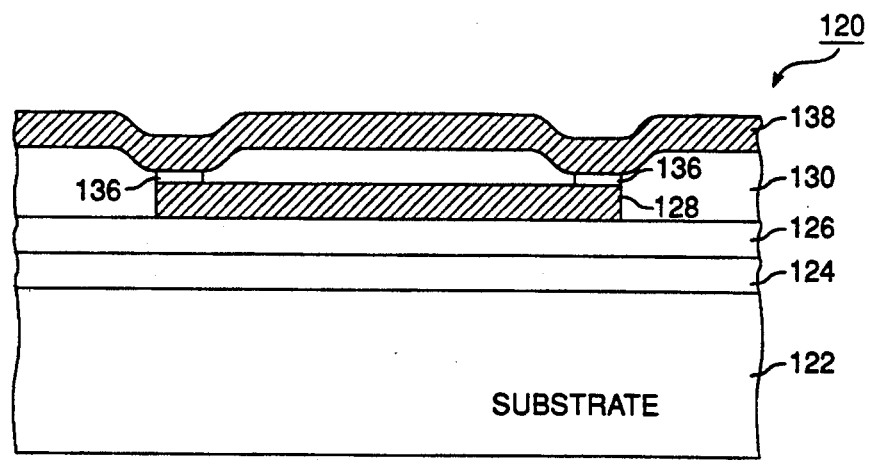
FIG. 6b is a cross sectional view of the antifuse depicted in FIG. 6a, through lines XX.

Referring now to FIGS. 6a and 6b, top and cross-sectional views, respectively, of an antifuse according to the present invention where both lower and upper electrodes are disposed in layers of the integrated circuit located above and insulated from the surface of the semiconductor substrate. Thus, antifuse 120 is fabricated on semiconductor substrate 122 after one or more intervening layers containing active circuit elements and other structures, represented by layer 124, have been formed and covered by insulating layer 126 as is conventional in the integrated circuit art.

Lower electrode 128 is formed on the surface of insulating layer 126. Lower electrode 128 may be made from a wide variety of conductive materials, including, but not limited to doped polysilicon, polysilicon silicide combinations, metal layers used in semiconductor interconnect layers, which may or may not include barrier layers where prudent. The particular material to use will depend somewhat on the particular application, and is largely a matter of design choice. Those of ordinary skill in the art will readily recognize how to form such layers and how to define such layers after formation by use of conventional semiconductor processing techniques to form a plurality of lower electrodes for antifuse structures as well as other structures.

A relatively thick dielectric layer 130, having a thickness greater than about 300 Å thick, is placed on top of lower electrode 128. Dielectric layer 130, as well as the other dielectric layers in the other embodiments of the present invention disclosed herein, may be made from a wide variety of materials which will readily suggest themselves to those of ordinary skill in the art. Such materials include, but are not limited to silicon dioxide, silicon nitride PSG, BPSG, and similar insulator materials used in the semiconductor industry. Dielectric layer 130 should be thick enough to produce an insulating structure which, if the antifuse containing it remains unprogrammed, does not have a sufficient capacitance to significantly degrade circuit performance.

Antifuse windows 132 and 134 (shown in FIG. 6a) are formed in dielectric layer 130. Antifuse windows 132 and 134 are apertures etched into dielectric layer 130 to expose the surface of lower electrode 128. Antifuse windows 132 and 134 are placed such that, if the photolithographic and other processes which form them are performed in a manner which does not introduce any layer misalignment to the semiconductor structure, they lie slightly over lower electrode 128 from its opposing edges. In a presently preferred embodiment, antifuse windows should be designed to occupy a combined area of about 0.16 $\mu m^2$ over lower electrode 128, assuming no layer misalignment.

After antifuse windows 132 and 134 are opened in the dielectric layer 130, antifuse dielectric regions 136a and 136b are simultaneously formed on the exposed surfaces of lower electrode 128. As in the other embodiments of the present invention, antifuse dielectric regions 136a and 136b may be chosen from a variety of materials known for use for that purpose by those of ordinary skill in the art.

Upper electrode 138 is then formed on the surface of dielectric layer 130 and antifuse dielectric regions 136a and 136b. Like lower electrode 128, upper electrode 138 may be formed from a variety of conducting materials used in the semiconductor industry. Use of a particular material will depend, for instance, on whether the antifuse is to be fabricated between a lower polysilicon layer and an upper polysilicon layer, a polysilicon layer and a metal layer, a lower metal layer and an upper metal layer, etc.

The present invention may be practiced using any combination of conductive materials for the upper and lower electrodes. Techniques for the formation of such layers are well within the level of ordinary skill in the art. After upper electrode 138 is formed, it may be defined using conventional photolithography and other semiconductor processing techniques to form a plurality of upper electrodes for a plurality of antifuses, and to form other useful structures.

Those of ordinary skill in the art will recognize that where the layers recited herein for the upper and lower electrodes are to be formed of materials, such as polysilicon or metals, which are normally utilized in semiconductor structures, these layers may have the thicknesses commonly employed for such layers in normal use in semiconductor structures.

While embodiments and applications of this invention have been shown and described, it would be apparent to those skilled in the art that many more modifications are possible without departing from the inventive concepts herein. The invention, therefore, is not to be restricted other than by the appended claims.

What is claimed is:

1. An antifuse including:
    a lower electrode having first and second opposing sides,
    a dielectric layer on the surface of said lower electrode,
    a pair of regions in said dielectric layer, one each of said pair of regions abutting said first and second opposing sides of said lower electrode, said regions having a thickness less than the thickness of the remainder of said dielectric layer, said regions having a total area of less than about 0.7 $\mu m^2$,
    an upper electrode disposed above said dielectric layer and lying over said pair of regions.

2. An antifuse including:
    a lower electrode Comprising a doped region in a semiconductor substrate, said lower electrode having first and second opposing sides, said lower electrode bounded on at least said first and second opposing sides by field oxide regions,
    a dielectric layer disposed on the surface of said semiconductor substrate,
    a pair of regions in said dielectric layer, one each of said pair of regions abutting said first and second opposing sides of said lower electrode, said regions having a thickness less than the thickness of the remainder of said dielectric layer, said regions having a total area of less than about 0.7 $\mu m^2$,
    an upper electrode disposed on the surface of said dielectric layer and lying over said pair of regions.

3. The antifuse of claim 2 wherein said upper electrode is formed from polysilicon.

4. The antifuse of claim 3 wherein said polysilicon is heavily doped.

5. The antifuse of claim 2 wherein said upper electrode is formed from a metal.

6. The antifuse of claim 2 wherein said dielectric layer is formed from silicon dioxide.

7. The antifuse of claim 2 wherein said dielectric layer is formed from silicon nitride.

8. The antifuse of claim 2 wherein said dielectric layer includes a first layer of silicon dioxide and a second layer of silicon nitride.

9. The antifuse of claim 2 wherein said dielectric layer includes a first layer of silicon nitride and a second layer of silicon dioxide.

10. The antifuse of claim 8, further including a third layer of silicon dioxide over said second layer of silicon nitride in said dielectric layer.

11. An antifuse including:
    a lower electrode comprising a layer of conductive material disposed above and insulated from a semiconductor substrate, said lower electrode having first and second opposing sides,
    a dielectric layer disposed on the surface of said lower electrode,
    a pair of regions in said dielectric layer, one each of said pair of regions abutting said first and second opposing sides of said lower electrode, said regions having a thickness less than the thickness of the remainder of said dielectric layer, said regions having a total area of less than about 0.7 $\mu m^2$,
    an upper electrode comprising a layer of conductive material disposed on the surface of said dielectric layer and lying over said pair of regions.

12. The antifuse of claim 11 wherein said lower and upper electrodes are formed from polysilicon.

13. The antifuse of claim 11 wherein said lower electrode is formed from polysilicon and said upper electrode is formed from a metal.

14. The antifuse of claim 11 wherein said lower and upper electrodes are formed from a metal.

15. The antifuse of claim 11 wherein said dielectric layer is formed from silicon dioxide.

16. The antifuse of claim 11 wherein said dielectric layer is formed from silicon nitride.

17. The antifuse of claim 11 wherein said dielectric layer includes a first layer of silicon dioxide and a second layer of silicon nitride.

18. The antifuse of claim 11 wherein said dielectric layer includes a first layer of silicon nitride and a second layer of silicon dioxide.

19. The antifuse of claim 17, further including a third layer of silicon dioxide over said second layer of silicon nitride in said dielectric layer.

* * * * *